United States Patent
Tailliet (10) Patent No.: US 6,549,048 B2
(45) Date of Patent: Apr. 15, 2003

(54) THRESHOLD AMPLIFIER (75) Inventor: François Tailliet, Le Tholonet (FR)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 09/925,979

(22) Filed: Aug. 9, 2001

(65) Prior Publication Data

US 2002/0075052 A1 Jun. 20, 2002

(30) Foreign Application Priority Data

Aug. 11, 2000 (FR) .............................. 00 10554

(51) Int. Cl.$^7$ ................................................ H03K 3/12
(52) U.S. Cl. .......................... 327/205; 327/206; 326/28
(58) Field of Search ................................ 327/205, 206, 327/199, 210, 214, 427, 73; 326/28

(56) References Cited

U.S. PATENT DOCUMENTS

| | | | |
|---|---|---|---|
| 5,341,033 A | 8/1994 | Koker | 327/206 |
| 5,886,556 A | * 3/1999 | Ganger et al. | 327/206 |
| 5,949,859 A | 9/1999 | O'Toole | 379/100.14 |
| 6,353,346 B1 | * 3/2002 | Chan | 327/112 |

FOREIGN PATENT DOCUMENTS

FR   2758422   7/1998   ............ H03B/5/26

OTHER PUBLICATIONS

Patent Abstracts of Japan, vol. 009, No. 310 (E–364), Dec. 6, 1985, & JP 60146522A (Suwa Seikosha KK), Aug. 2, 1985.

* cited by examiner

Primary Examiner—Toan Tran
Assistant Examiner—Hiep Nguyen
(74) Attorney, Agent, or Firm—Allen, Dyer, Doppelt Milbrath & Gilchrist, P.A.; Lisa K. Jorgenson (57) ABSTRACT

A threshold amplifier receives a logic supply voltage and a ground voltage and includes a Schmitt trigger comprising an inverter stage and a hysteresis stage connected to the inverter stage for setting a high and a low hysteresis threshold. A disabling circuit disables the hysteresis stage as a function of a level of the logic supply voltage. The threshold amplifier further includes a detection circuit for detecting the level of the logic supply voltage with respect to a detection threshold, and for activating the disabling circuit for disabling the hysteresis stage when the level of the logic supply voltage is below the detection threshold.

33 Claims, 4 Drawing Sheets

(PRIOR ART)

Fig. 2b

(PRIOR ART)

THRESHOLD AMPLIFIER

FIELD OF THE INVENTION

The present invention relates to the field of integrated circuits, and more particularly, to an integrated circuit including a threshold amplifier.

BACKGROUND OF THE INVENTION

Integrated circuits are extensively used in a wide variety of environments. To meet all the needs of the market, it is sometimes necessary to plan for manufacturing options suited to specific goals. The management of these manufacturing options is costly because it implies different sets of manufacturing masks, different sets of tests, etc.

If we take the example of applications in highly noisy environments, for example automobile applications, it is especially necessary to filter the logic power supply applied to the integrated circuit. It is usual for this purpose to provide a Schmitt trigger circuit. This well-known circuit comprises an inverter stage associated with a hysteresis threshold-setting stage, by which two switching thresholds are obtained. The difference in voltage between these two thresholds gives the value of the hysteresis. Between these two thresholds, no switching of the inverter stage is possible. This characteristic is especially used to obtain a clean signal from a noisy signal.

However, Schmitt trigger type circuits have some drawbacks. They are slower to switch over than a simple inverter. Furthermore, there is always an active feedback loop so that the trigger is in a state of permanent power consumption, even in standby mode. Finally, it is hard to use them in low-voltage applications. For example, in CMOS technology, the switching thresholds defined for 0 and 1 are 0.3 Vcc and 0.7 Vcc, respectively. At low supply voltage, these 0.3 Vcc and 0.7 Vcc levels impose a respective operation of the N and P transistors at levels close to their threshold voltage. Thus, the Schmitt trigger circuit, which raises the threshold of the N and P input transistors by the substrate effect, is unfavorable to the detection of the 0.3 Vcc and 0.7 Vcc levels at low voltage.

This is why a manufacturing option is usually provided for these circuits. In a manufacturing option for noisy applications, the Schmitt trigger circuit is entirely implanted with the inverter stage and the hysteresis threshold-setting stage. For non-noisy applications or low-voltage applications, only the inverter stage, which does not have the above-mentioned drawbacks, is implanted. For example, an appropriate metal mask may be used to make the corresponding interconnections of the hysteresis threshold-setting stage.

SUMMARY OF THE INVENTION

An object of the invention is to provide an integrated circuit suited to different applications.

Another object of the invention is to reduce the manufacturing cost of such integrated circuits.

These and other objects, advantages and features of the invention are provided by a threshold amplifier that comprises a Schmitt trigger with hysteresis for high levels of the logic supply voltage and operates like a simple inverter for low levels of the logic supply voltage. Thus, there is an automatic switching from one type of operation to the other according to the level of the power supply voltage.

The invention relates to an amplifier of this kind and its use in an integrated circuit, especially to filter external logic signals. The invention therefore relates to a threshold amplifier receiving a logic supply voltage and a ground voltage as supply voltages and comprises a Schmitt trigger with an inverter stage and a stage for setting the high and low hysteresis thresholds, wherein the amplifier comprises a circuit for disabling the hysteresis stage as a function of the level of the logic supply voltage.

BRIEF DESCRIPTION OF THE DRAWINGS

Other features and advantages of the invention are described in detail in the following description given by way of a non-restricted indication with reference to the appended figures, of which.

DETAILED DESCRIPTION OF THE PREFERRED EMBODIMENTS

Figure 1:
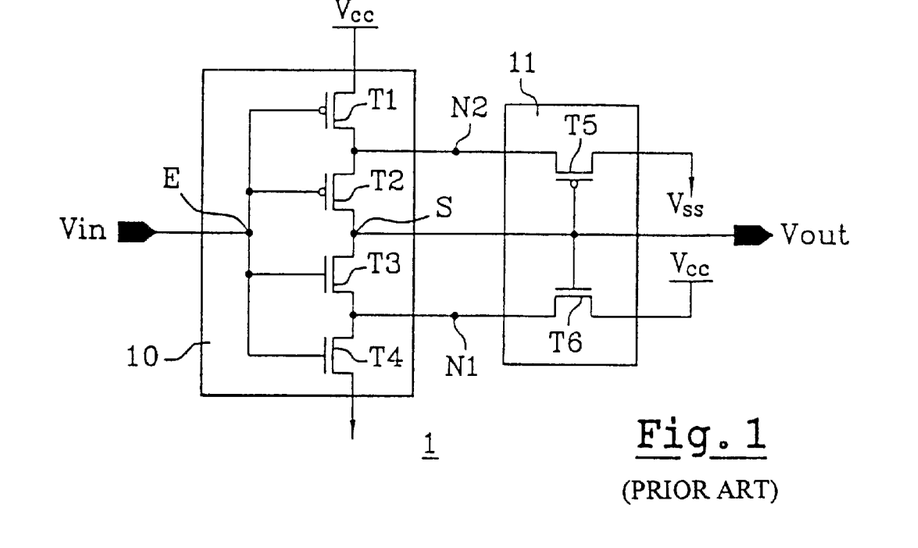
FIG. 1 shows a Schmitt trigger circuit using CMOS technology according to the prior art.

The invention will be explained more particularly with reference to an exemplary embodiment using CMOS technology. However, the invention can be applied to all technologies. FIG. 1 shows an exemplary embodiment of a Schmitt trigger circuit according to the prior art using CMOS technology.

This Schmitt trigger circuit 1 has an inverter stage 10 and a hysteresis threshold-setting stage 11. This Schmitt trigger circuit thus has a top or upward threshold voltage Vh for an input signal Vin, and a bottom or downward threshold voltage Vb. The value of the hysteresis is given by the difference Vh–Vb between these two thresholds, generally in the range of Vcc/5 to Vcc/3.

The inverter stage 10 has, in an upper arm, two P-type MOS transistors T1 and T2 series-connected between the supply voltage and the output node S of the inverter stage. In a lower arm, two N-type MOS transistors T3 and T4 are series-connected between the output node S of the inverter stage and ground Vss. The gates or control electrodes of these four transistors are connected together and form the input E of the inverter stage, to which an input signal Vin is applied. The output node S of the inverter stage gives the filtered signal Vout.

The stage 11 for setting the hysteresis thresholds Vh and Vb includes, in the example, two MOS transistors. There is a first P-type MOS transistor T5 connected between the midpoint N2 of the upper arm of the inverter stage and ground Vss. The term midpoint refers to the connection point between the two transistors of the arm. The gate of the transistor T5 is controlled by the signal Vout of the inverter stage. There is a second N-type MOS transistor T6 connected between the midpoint N1 of the lower arm of the inverter stage and the supply voltage Vcc. Its gate is controlled by the output S of the inverter stage that gives the output signal Vout of the threshold amplifier.

The transistor T5 sets the bottom threshold Vb of the input voltage Vin of the amplifier by lowering the switching point of the upper arm of the inverter stage, and the transistor T6 fixes the upward threshold Vh of the input voltage Vin by raising the switching point of the lower arm of the inverter stage.

The transistors T4 and T6 form a feedback loop through which the upward threshold Vh of the input voltage is defined, in raising the point at which the transistor T3 becomes conductive. The transistors T1 and T5 form a feedback loop through which the downward threshold Vb of the input voltage is defined, in lowering the point at which the transistor T2 becomes conductive.

The Schmitt trigger works as follows. Starting from the conditions in which the input voltage Vin is at zero and the output signal Vout of the inverter stage is at 1 (Vcc), the transistor T5 is off. The transistor T6 is on and switches over a maximum voltage of about Vcc−Vtn to the node N1. Vtn is the threshold voltage of the transistor T6. When the level of the input voltage Vin becomes greater than the threshold voltage of the transistor T4 (Vtn), this transistor turns on. The voltage at the node N1 has to be made to fall. This lowers the source voltage of the transistor T3 and tends to make it conductive. The inverter switches over, and the output signal Vout goes to zero.

The voltage at the node N1 depends on the conduction ratios between the transistors T4 and T6. In other words, the upward threshold Vh is fixed by the geometrical ratios W/L of the transistors T4 and T6.

Conversely, when the output signal Vout of the inverter is at zero, the transistor T6 is off. The transistor T5 is on and imposes a minimum voltage, equal to about its threshold voltage Vtp on the node N2. When the voltage Vin becomes smaller than Vcc−Vtp, the transistor T1 comes on. The voltage at the node N2 must be raised, and this tends to turn on the transistor T2. The inverter switches over, and the output signal Vout of the inverter goes to 1.

The voltage at the node N2 depends on the conduction ratios between the transistors T1 and T5. In other words, the downward threshold Vb is fixed by the geometrical ratios W/L of the transistors T1 and T5.

Figure 2A:
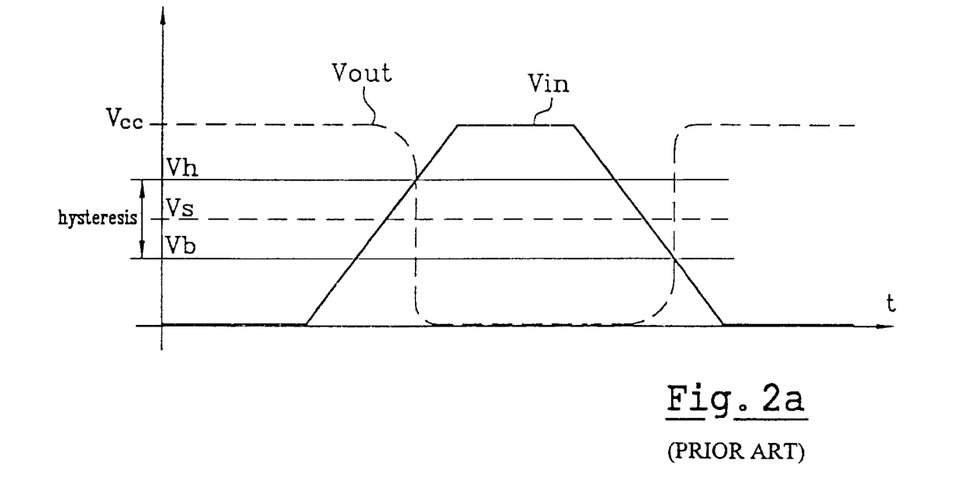
FIG. 2a shows the transfer curve of the circuit shown in FIG. 1.
Figure 2B:
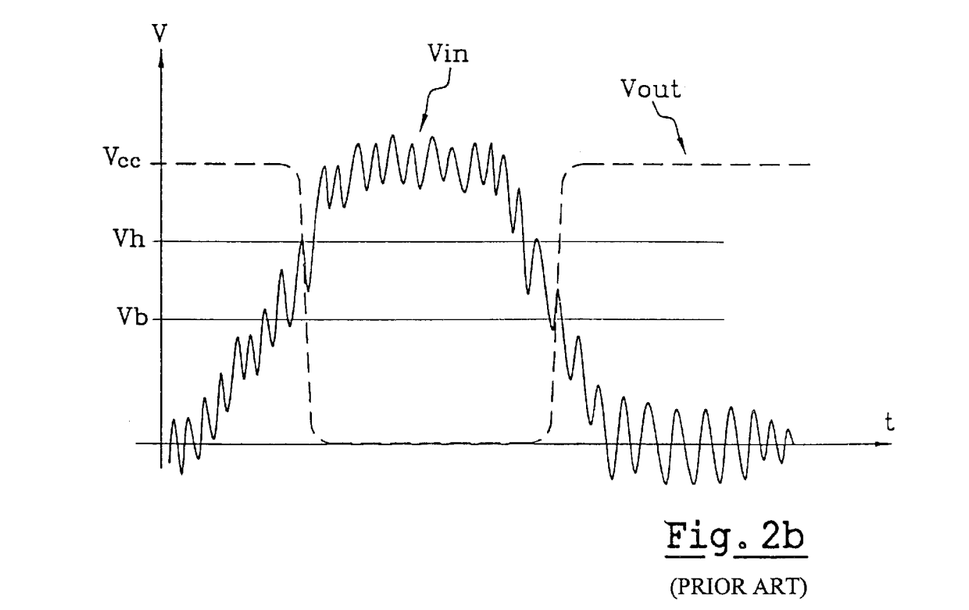
FIG. 2b shows the shape of a signal recovered at the output of the circuit shown in FIG. 1 from a noisy input signal.

FIGS. 2a and 2b show the output signal Vout given by a Schmitt trigger circuit of this kind, as a function of the input voltage Vin that is applied to it. Dashed lines are used to depict the switching threshold Vs of a simple inverter, which is typically in the range of Vcc/2. FIG. 2b shows a more specific view of the voltage response of this circuit with respect to a noisy input.

These figures show that if the logic supply voltage is low, the threshold amplifier is no longer efficient because the value of the hysteresis Vh−Vb becomes far smaller than the supply voltage. Thus, the use of a Schmitt trigger becomes disadvantageous both with respect to the switching speed and to power consumption.

Figure 3:
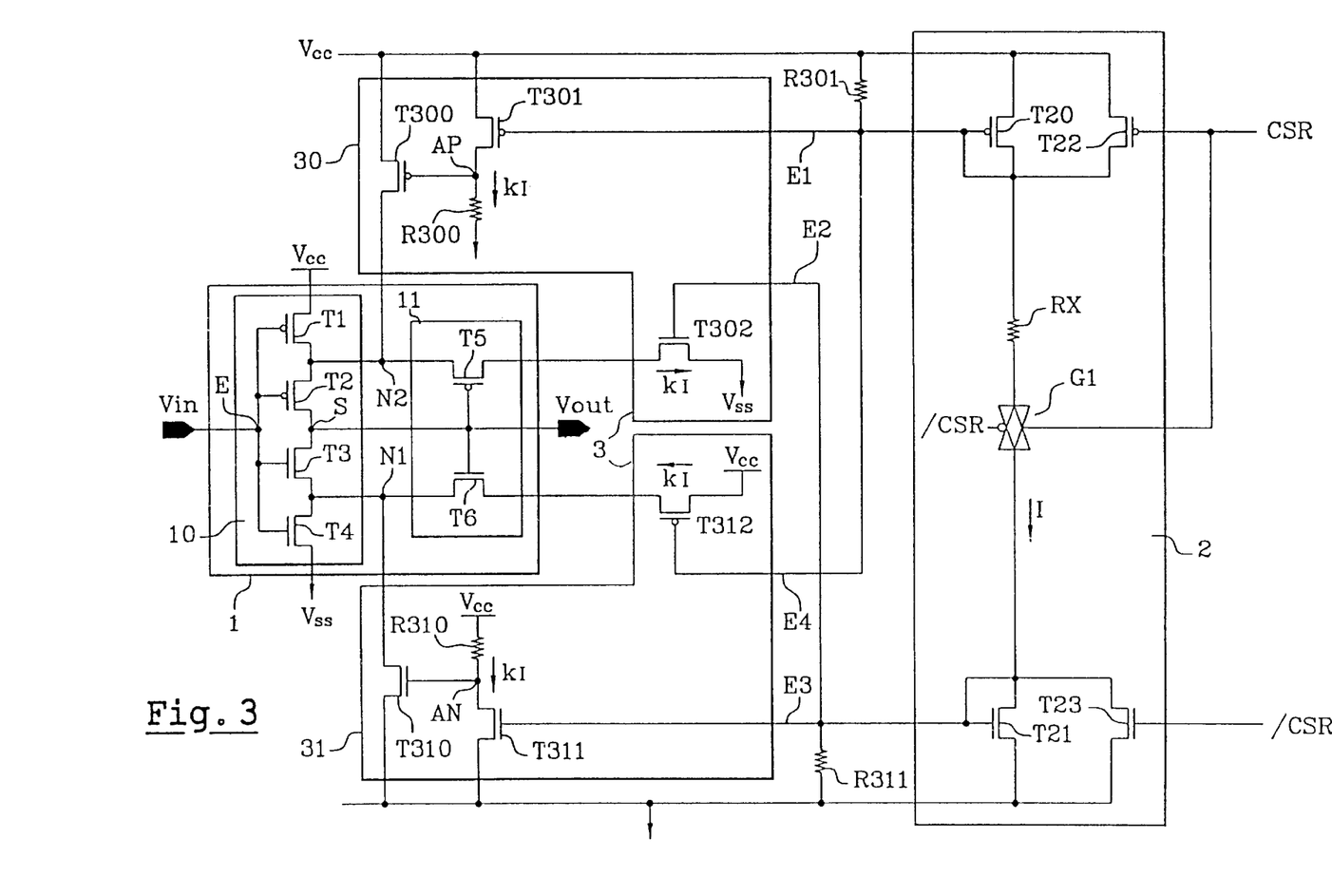
FIG. 3 shows a threshold amplifier according to the present invention.

FIG. 3 shows an exemplary embodiment of a threshold amplifier according to the invention. It comprises a Schmitt trigger circuit 1, a supply voltage threshold detection circuit 2, and a circuit 3 for disabling the hysteresis-setting stage. An amplifier of this kind works as a Schmitt trigger if the level of the logic supply voltage is high enough. If not, it works as a simple inverter.

To simplify the explanation, the elements of the threshold amplifier shown in FIG. 3 already described with reference to FIG. 1 bear the same references. The threshold amplifier according to the invention thus has a Schmitt trigger 1 comprising the same elements T1 to T6 as in FIG. 1, a circuit 2 for detecting the level of the logic supply voltage Vcc with respect to a detection threshold, and a circuit 3 for disabling the hysteresis threshold-setting stage of the Schmitt trigger.

In the example, the detection circuit 2 comprises a current detection arm with respect to a detection threshold Sd. This detection arm in the example has a P-type transistor T20, a resistor RX and an N-type transistor T21 series-connected between the logic supply voltage Vcc and ground. Each of the transistors T20 and T21 is connected as a diode, with the drain and the gate connected together. The voltage detection threshold Sd set up in this arm is thus equal to the sum of the threshold voltages of the transistors T20 and T21, giving Vtp+Vtn in the example.

If the logic supply voltage Vcc has a level below this threshold, none of the transistors T20 and T21 are on, and the current I is zero in the detection arm. If the level of the logic supply voltage Vcc is higher than this threshold, then a non-zero current I goes into this arm. This intensity of this non-zero current I is especially great as the level of the logic voltage Vcc is higher than the detection threshold. Indeed, we have:

$$I=[Vcc-Vtn_{(T21)}-Vtp_{(T20)}]/RX.$$

This absence or presence of current is used in the disabling circuit to disable or enable the hysteresis threshold-setting stage. The disabling circuit 3 has two disabling devices 30 and 31, one for each Schmitt trigger threshold controlled by the detection circuit 2.

The first disabling device 30 associated with the feedback loop defined by the transistors T1 and T5 comprises a first P-type transistor T300 connected between the logic supply voltage Vcc and the node N2, and a second P-type transistor T301 series-connected with a resistor R300 between the logic supply voltage Vcc and ground. The resistor R300 is connected on the ground side. The connection point AP between the second transistor and the resistor R300 is connected to the gate of the transistor T300, and the gate of the second transistor forms an input E1 of the disabling circuit, controlled by the detection circuit. The first disabling device 30 further includes a third N-type transistor T302 series-connected between the transistor T5 of the Schmitt trigger and ground, having its gate forming an input E2 of the disabling circuit controlled by the detection circuit.

In the example, the input E1 is connected to the gate of the transistor T20 of the detection circuit 2, and the input E2 is connected to the gate of the transistor T21 of the detection circuit. Similarly with respect to the device 30, the disabling device 31 associated with the feedback loop defined by the transistors T4 and T6 of the Schmitt trigger comprises a first N-type transistor T310 connected between the node N1 and ground, and a second N-type transistor T311 series-connected with a resistor R310 between the logic supply voltage Vcc and ground. The resistor R310 is connected on the supply voltage Vcc side. The connection point AN between the second transistor and the resistor R310 is connected to the gate of the transistor T310, and the gate of the second transistor forms an input E3 of the disabling device controlled by the detection circuit. The disabling device 31 further includes a third P-type transistor T312 series-connected between the transistor T6 of the Schmitt trigger and the logic supply voltage Vcc, having its gate forming an input E4 of the disabling device controlled by the detection circuit.

In the example, the input E3 of the disabling device 31 is connected to the gate of the transistor T21 of the detection circuit 2, and the input E4 is connected to the gate of the transistor T20 of the detection circuit. In fact, the inputs E1 and E4, and E2 and E3 respectively of the disabling circuit 3 are common.

The current in each of the disabling devices and 31 is thus controlled by the detection circuit 2. The transistors T301 and T302 of the first device 30 are each mounted as a current mirror. The first one with respect to the transistor T20 and the second with respect to the transistor T21. Similarly, the transistors T311 and T312 of the second device 31 are each mounted as current mirrors. The former with respect to the transistor T21 and the latter with respect to the transistor T20.

In the example, the proportionality factor k is the same for each of the transistors T301, T302, T311 and T312, but this is not required. If the current I in the detection circuit is not zero, it is copied with a proportionality factor k in each of the transistors T301, T302, T311, T312. This makes it possible for the hysteresis threshold-setting stage to be active. The value of the hysteresis is then a function of the level of the supply voltage. If the level is sufficiently above the detection threshold Sd, the disabling circuit has no effect on the Schmitt trigger circuit and the hysteresis has its nominal value, typically between Vcc/5 and Vcc/3. If the level of the supply voltage Vcc is close to the detection threshold, the value of the hysteresis is lower.

If not, when the level of the supply voltage is below the detection threshold, the current I is zero, and there is no hysteresis. The threshold amplifier then works as a pure inverter. The disabling of the hysteresis threshold-setting stage is obtained by forcing each of the connection nodes N1 and N2 between the inverter stage and the hysteresis threshold-setting stage to the appropriate supply voltage, namely to ground Vss for N1 and to Vcc for N2. This function is provided by the elements T300 (for N2) and T310 (for N1), with each controlled by the current control inverter arms formed by the elements T301 and R300, and T311 and R310 respectively.

To prevent the transistors T5 and T6 of the hysteresis threshold-setting stage from being conductive, it is also preferable to disconnect them from their power supply voltage. This is what is obtained by the transistors T302 and T312.

Figure 4:
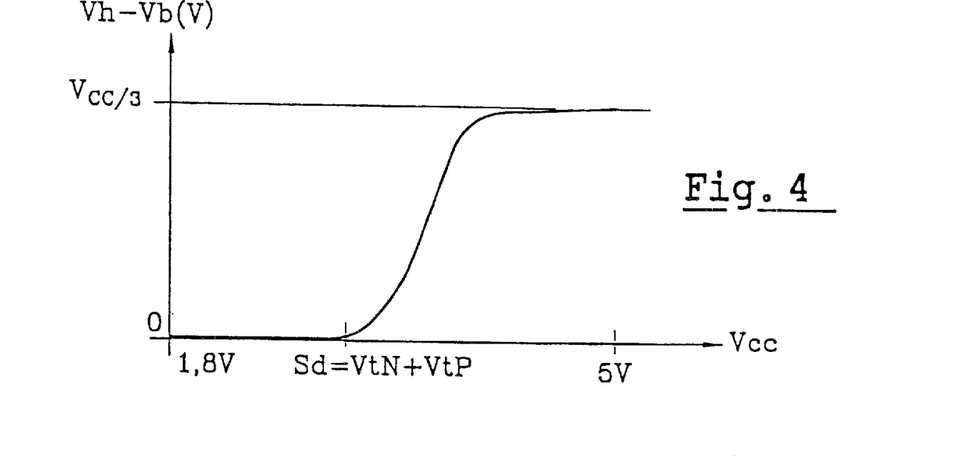
FIG. 4 shows a variation of the value of the hysteresis with the supply voltage in a threshold amplifier according to the present invention.

The variation of the hysteresis value as a function of the level of the supply voltage Vcc is shown in FIG. 4. As long as the supply voltage Vcc is below the detection threshold Sd, the value of the hysteresis is zero and the threshold amplifier works as an inverter. As soon as the supply voltage Vcc has a level greater than the detection threshold Sd, there is a hysteresis whose value is all the closer to the nominal value Vcc/3 as we are distant from the detection threshold.

The working of the disabling circuit 3 shall be explained in greater detail by addressing the first feedback loop T1/T5 and the associated disabling device 30. The dual operation can easily be deduced therefrom for the second feedback loop T4/T6 and the associated disabling device 32.

When the logic supply voltage Vcc has a level greater than that of the detection threshold Sd, there is a non-zero current I in the arm T20, RX, T21. This current is copied with a proportionality factor k in the transistor T301 by current mirror (T20, T301). The voltage at the node AP will gradually rise to Vcc, and the transistor T300 is off. Furthermore, the transistor T302 mounted as a current mirror, and the transistor T21 of the detection circuit is on. It thus grounds the drain of the transistor T5. The feedback loop T1/T5 of the Schmitt trigger is active.

If the logic supply voltage level Vcc is below the detection threshold Sd, the current I is zero in the detection arm, and the transistor T301 is off. The transistor T300 is on because its gate is drawn to ground by the resistor R300 and brings the node N2 to Vcc. The transistor T302 is off, placing the drain of the transistor T5 at a floating potential. The transistor T5 is therefore off and its feedback effect is disabled. The Schmitt trigger then behaves like a simple inverter.

The detection threshold of the detection circuit 2 can be increased if necessary by the addition, between the two transistors T20 and T21, of other diode-mounted transistors. For example, if another P-type transistor is added between the transistor T20 and the resistor RX, the detection threshold Sd becomes equal to 2Vtp+Vtn.

Preferably, a transfer gate G1 is provided in the current detection arm of the detection circuit. This transfer gate G1 is controlled by a control signal CSR (and /CSR). When this signal is at 0, the transfer gate is open and no current can pass. If it is at 1, the transfer gate is equivalent to a short circuit and the current detection arm works normally. In the example, this transfer gate G1 is series-connected between the resistor RX and the transistor T21. It is thus possible to prevent any consumption in the detection arm, for example when the threshold amplifier is not used.

However, when the detection arm is open (CRS at 0), the inputs E1, E2, E3 and E4 of the disabling circuit 3 are at a floating potential. To be sure that the transistors T301, T302, T311 and T312 are off, so that they themselves do not consume current, it is preferably planned as shown in FIG. 3 that the detection circuit 2 will furthermore comprise a first P-type transistor T22 controlled at its gate by the control signal CSR and parallel-connected to the transistor T20 between the supply voltage Vcc and the drain of the transistor T20. The detection circuit 2 also includes a second N-type transistor T23 controlled at its gate by the reverse of the control signal, and is parallel-connected to the transistor T21 between the drain of the transistor T21 and ground Vss.

When the signal CSR is at 0, the transistor T22 brings the inputs E1 and E4 of the disabling circuit 3 to a level close to Vcc, and the transistor draws the inputs E3 and E2 to ground. Thus, the transistors T301, T302, T311, T312 are off. As soon as the control signal CSR is at 1 (/CSR at 0), the transistors T22 and T23 go to the off state and no longer play a role in the working of the amplifier.

The control signal CSR may correspond typically to the integrated circuit selection signal or chip select signal. Thus, when the circuit is not selected or no longer selected, the threshold amplifier consumes no current.

In one variation, an additional resistor is provided at the inputs E1 and E3 of the disabling circuit 3 to help in the fast blocking of the transistors T301 and T311 when the current I in the detection arm becomes non-zero. The value of this alternative embodiment is that it makes it possible to activate the hysteresis at far greater speed when the circuit is selected. There is no need to wait for all the internal nodes to get charged.

FIG. 3 thus shows a resistor R301 in the device 30 connected between a logic supply voltage Vcc and the gate of the transistor T301, and a resistor R311 in the device 31 connected between ground and the gate of the transistor T311.

In a threshold amplifier according to the invention, the passage from one mode of operation of the threshold amplifier to another (using a Schmitt trigger with hysteresis or a simple inverter) is made gradually as soon as the detection threshold is crossed. The lower the current, at voltage levels that are lower than the detection threshold, the smaller the hysteresis, as can be seen in FIG. 4.

Thus, the threshold amplifier according to the invention behaves like an inverter if the logic supply voltage Vcc has a level lower than or equal to the detection threshold. It switches to about Vcc/2, abruptly (fast switching) like a pure Schmitt trigger if the logic supply voltage Vcc has a level far higher than the detection threshold. It switches intermediately for voltage levels a little higher than the detection threshold, with a hysteresis that is all the smaller as the operation is close to the detection threshold.

The variation curve of the value of the hysteresis with the level of the supply voltage depends on factors of proportionality of the current mirror structures used between the detection circuit and the disabling circuit. By acting on these factors of proportionality, this curve is modified.

Figure 5A:
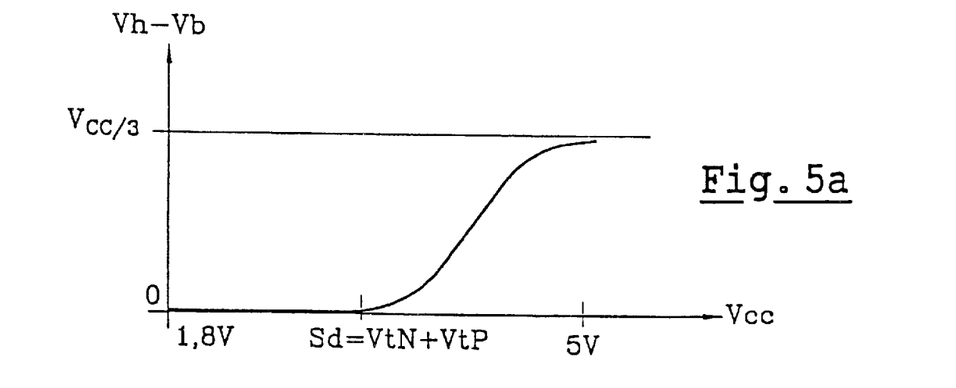
FIGS. 5a and 5b show the influence on the hysteresis of the proportionality factor of the current mirrors in a threshold amplifier according to the present invention.
Figure 5B:
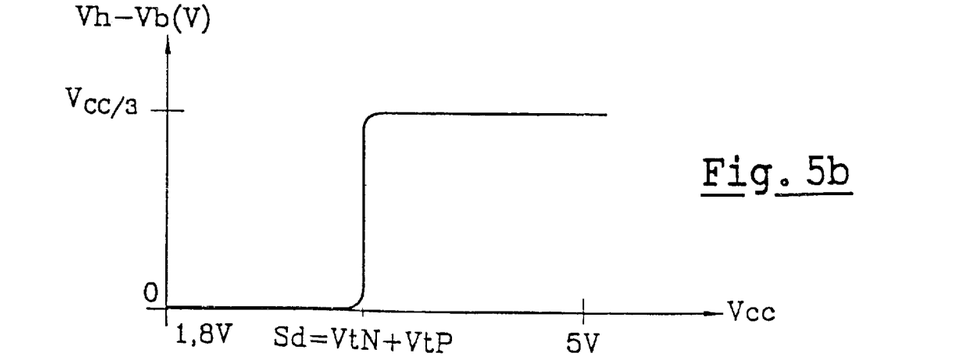

FIG. 5a thus shows a variation curve of the hysteresis that is not abrupt. This curve corresponds to a low proportionality factor k. In FIG. 5b, the variation curve of the hysteresis is very abrupt, corresponding to a high of proportionality factor k.

In the same integrated circuit, it is possible to have several threshold amplifiers, each to filter one input of the integrated circuit. Now the detection circuit 2 by itself can consume several tens of microamperes at a logic supply voltage of 5 volts.

Figure 6:
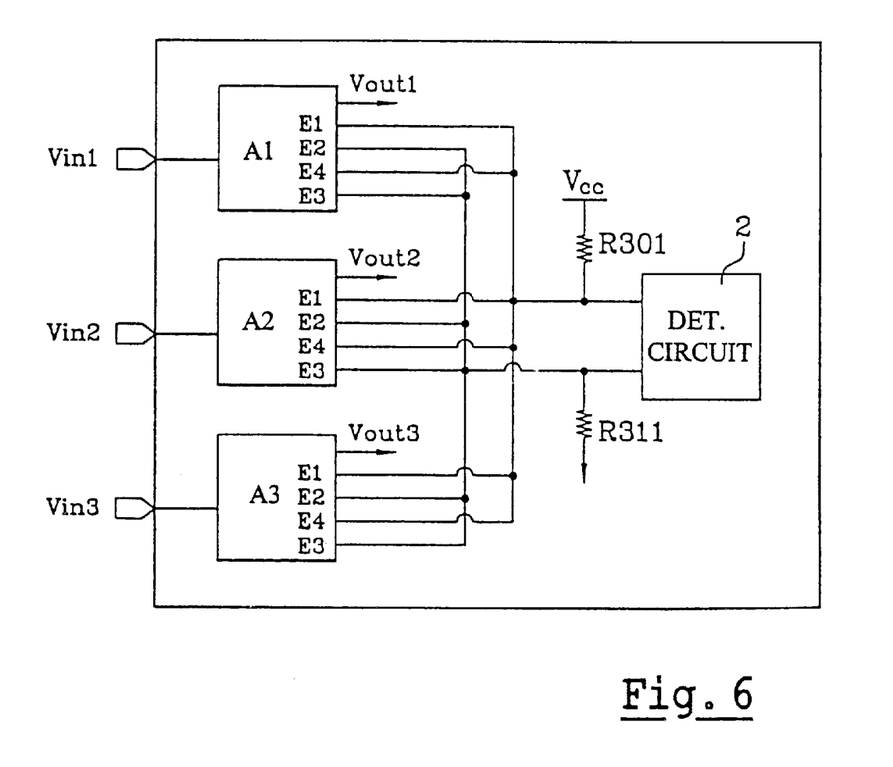
FIG. 6 shows an integrated circuit comprising several threshold amplifiers according to the present invention for filtering input signals.

To reduce the total consumption of the integrated circuit, and as shown schematically in FIG. 6, it is advantageously provided that a detection circuit 2 will be common to several threshold amplifiers A1, A2, A3. The detection circuit 2 then controls the inputs E1 to E4 of each amplifier. In the example, the inputs E1 to E4 are controlled in common (by T20) and the inputs E2 and E3 are controlled in common (by T21). The blocking resistors R301 and R311, designed as inputs E1 and E3 of the disabling circuit of each amplifier, can also be common to the threshold amplifiers as shown in FIG. 6.

The invention has been described in an exemplary embodiment using CMOS technology. The invention can be applied in general in all technologies, for example in bipolar technology. Those skilled in the art will be able to make the necessary adaptations as a function of the planned technology. It can also be applied in general to different variations of the Schmitt trigger structure of the prior art.

That which is claimed is:

1. A threshold amplifier receiving a logic supply voltage and a reference voltage and comprising:
    a Schmitt trigger comprising an inverter stage and a hysteresis stage connected to said inverter stage for setting a high and a low hysteresis threshold; and
    a disabling circuit for disabling said hysteresis stage based upon a level of the logic supply voltage.

2. A threshold amplifier according to claim 1, further comprising a detection circuit for detecting the level of the logic supply voltage with respect to a detection threshold, and for activating said disabling circuit for disabling said hysteresis stage when the level of the logic supply voltage is below the detection threshold.

3. A threshold amplifier according to claim 2, wherein said detection circuit comprises a current detection arm.

4. A threshold amplifier according to claim 3, wherein said current detection arm comprises a first detection transistor, a resistor and a second detection transistor series-connected between the logic supply voltage and the reference voltage, with said first and second detection transistors being diode-connected.

5. A threshold amplifier according to claim 4, wherein said current detection arm comprises at least one other diode-connected detection transistor connected between said first and second detection transistors.

6. A threshold amplifier according to claim 4, wherein said disabling circuit comprises means for copying a current conducting in said current detection arm.

7. A threshold amplifier according to claim 6, wherein said detection circuit comprises:
    a third detection transistor parallel-connected to said first detection transistor; and
    a fourth detection transistor parallel-connected to said second detection transistor, said third and fourth detection transistors being controlled by a control signal used to deactivate said copying means.

8. A threshold amplifier according to claim 4, wherein said current detection arm comprises a transfer gate connected between said first and second detection transistors, with said transfer gate being controlled by a control signal used to open said current detection arm.

9. A threshold amplifier according to claim 4, wherein said hysteresis stage includes a high hysteresis threshold connection node connected to a first output of said inverter stage, and a low hysteresis threshold connection node connected to a second output of said inverter stage; and wherein said disabling circuit comprises:
    a first high threshold disabling transistor connected between the high hysteresis threshold connection node and the logic supply voltage;
    a second high threshold disabling transistor connected to said first high threshold disabling transistor for control thereof;
    a first low threshold disabling transistor connected between the low hysteresis threshold connection node and the reference voltage; and
    a second low threshold disabling transistor connected to said first low threshold disabling transistor for control thereof.

10. A threshold amplifier according to claim 9, wherein said second high threshold disabling transistor is connected as a current mirror to said first detection transistor, and said second low threshold disabling transistor is connected as a current mirror to said second detection transistor.

11. A threshold amplifier according to claim 9, further comprising:
    a high threshold resister series-connected between said second high threshold disabling transistor and the reference voltage, with a connection point therebetween providing a control signal to said first high threshold disabling transistor; and
    a low threshold resister series-connected between said second low threshold disabling transistor and the logic supply voltage, with a connection point therebetween providing a control signal to said first low threshold disabling transistor.

12. A threshold amplifier according to claim 4, wherein said disabling circuit further comprises:
    a third high threshold disabling transistor connected between said hysteresis stage and the logic supply voltage, with said third high threshold disabling transistor being connected as a current mirror to said second detection transistor; and
    a third low threshold disabling transistor connected between said hysteresis stage and the reference voltage, with said third low threshold disabling transistor being connected as a current mirror to said first detection transistor.

13. A threshold amplifier according to claim 12, wherein a ratio of proportionality of the current mirrors is a function of a slope of variation of the hysteresis with the level of the logic supply voltage.

14. A threshold amplifier receiving a logic supply voltage and a reference voltage and comprising:
   an inverter stage;
   a hysteresis stage connected to said inverter stage for setting a high and a low hysteresis threshold;
   a disabling circuit for disabling said hysteresis stage based upon a level of the logic supply voltage; and
   a detection circuit for detecting the level of the logic supply voltage with respect to a detection threshold, and for activating said hysteresis stage when the level of the logic supply voltage is above a detection threshold.

15. A threshold amplifier according to claim 14, wherein said detection circuit comprises a current detection arm comprising a first detection transistor, a resistor and a second detection transistor series-connected between the logic supply voltage and the reference voltage, with said first and second detection transistors being diode-connected.

16. A threshold amplifier according to claim 15, wherein said detection circuit comprises:
   a third detection transistor parallel-connected to said first detection transistor; and
   a fourth detection transistor parallel-connected to said second detection transistor.

17. A threshold amplifier according to claim 15, wherein said hysteresis stage includes a high hysteresis threshold connection node connected to a first output of said inverter stage, and a low hysteresis threshold connection node connected to a second output of said inverter stage; and wherein said disabling circuit comprises:
   a first high threshold disabling transistor connected between the high hysteresis threshold connection node and the logic supply voltage;
   a second high threshold disabling transistor connected to said first high threshold disabling transistor for control thereof;
   a first low threshold disabling transistor connected between the low hysteresis threshold connection node and the ground supply voltage; and
   a second low threshold disabling transistor connected to said first low threshold disabling transistor for control thereof.

18. A threshold amplifier according to claim 17, wherein said second high threshold disabling transistor is connected as a current mirror to said first detection transistor, and said second low threshold disabling transistor is connected as a current mirror to said second detection transistor.

19. A threshold amplifier according to claim 18, further comprising:
   a high threshold resister series-connected between said second high threshold disabling transistor and the reference voltage, with a connection point therebetween providing a control signal to said first high threshold disabling transistor; and
   a low threshold resister series-connected between said second low threshold disabling transistor and the logic supply voltage, with a connection point therebetween providing a control signal to said first low threshold disabling transistor.

20. A threshold amplifier according to claim 15, wherein said disabling circuit further comprises:
   a third high threshold disabling transistor connected between said hysteresis stage and the logic supply voltage, with said third high threshold disabling transistor being connected as a current mirror to said second detection transistor; and
   a third low threshold disabling transistor connected between said hysteresis stage and the reference voltage, with said third low threshold disabling transistor being connected as a current mirror to said first detection transistor.

21. An integrated circuit comprising:
   at least one threshold amplifier receiving a logic supply voltage and a reference voltage and comprising
      a Schmitt trigger comprising an inverter stage and a hysteresis stage connected to said inverter stage for setting a high and a low hysteresis threshold, and
      a disabling circuit for disabling said hysteresis stage based upon a level of the logic supply voltage.

22. An integrated circuit according to claim 21, further comprising a detection circuit for detecting the level of the logic supply voltage, and for activating said disabling circuit for disabling said hysteresis stage when the level of the logic supply voltage is below a detection threshold.

23. An integrated circuit according to claim 22, wherein said detection circuit comprises a current detection arm comprising a first detection transistor, a resistor and a second detection transistor series-connected between the logic supply voltage and the reference voltage, with said first and second detection transistors being diode-connected.

24. An integrated circuit according to claim 23, wherein said detection circuit comprises:
   a third detection transistor parallel-connected to said first detection transistor; and
   a fourth detection transistor parallel-connected to said second detection transistor.

25. An integrated circuit according to claim 23, wherein said hysteresis stage includes a high hysteresis threshold connection node connected to a first output of said inverter stage, and a low hysteresis threshold connection node connected to a second output of said inverter stage; and wherein said disabling circuit comprises:
   a first high threshold disabling transistor connected between the high hysteresis threshold connection node and the logic supply voltage;
   a second high threshold disabling transistor connected to said first high threshold disabling transistor for control thereof;
   a first low threshold disabling transistor connected between the low hysteresis threshold connection node and the reference voltage; and
   a second low threshold disabling transistor connected to said first low threshold disabling transistor for control thereof.

26. An integrated circuit according to claim 25, wherein said second high threshold disabling transistor is connected as a current mirror to said first detection transistor, and said second low threshold disabling transistor is connected as a current mirror to said second detection transistor.

27. An integrated circuit according to claim 21, wherein said at least one threshold amplifier comprises a plurality of threshold amplifiers; and the integrated circuit further comprising a circuit for detecting the logic supply voltage that is common to more than one of said threshold amplifiers.

28. An integrated circuit according to claim 21, further comprising an input for receiving the logic supply voltage;

and wherein at least one threshold amplifier filters the logic supply voltage being applied to the input.

29. A method for operating a threshold amplifier receiving a logic supply voltage and a reference voltage and comprising an inverter stage and a hysteresis stage connected to said inverter stage for setting a high and a low hysteresis threshold, the method comprising:

disabling the hysteresis stage based upon a level of the logic supply voltage.

30. A method according to claim 29, further comprising:

detecting the level of the logic supply voltage; and activating a disabling circuit for disabling the hysteresis stage when the level of the logic supply voltage is below a detection threshold.

31. A method according to claim 30, wherein the detecting is performed using a detection circuit comprising a current detection arm comprising a first detection transistor, a resistor and a second detection transistor series-connected between the logic supply voltage and the reference voltage, with the first and second detection transistors being diode-connected.

32. A method according to claim 31, wherein the hysteresis stage includes a high hysteresis threshold connection node connected to a first output of the inverter stage, and a low hysteresis threshold connection node connected to a second output of the inverter stage; and wherein the disabling circuit comprises:

a first high threshold disabling transistor connected between the high hysteresis threshold connection node and the logic supply voltage;

a second high threshold disabling transistor connected to the first high threshold disabling transistor for control thereof;

a first low threshold disabling transistor connected between the low hysteresis threshold connection node and the reference voltage; and a second low threshold disabling transistor connected to the first low threshold disabling transistor for control thereof.

33. A method according to claim 32, wherein the second high threshold disabling transistor is connected as a current mirror to the first detection transistor, and the second low threshold disabling transistor is connected as a current mirror to the second detection transistor.

* * * * *